United States Patent
Kim et al.

(10) Patent No.: US 8,946,789 B2
(45) Date of Patent: Feb. 3, 2015

(54) SEMICONDUCTOR DEVICE, METHOD OF MANUFACTURING THE SAME, AND ELECTRONIC DEVICE INCLUDING THE SEMICONDUCTOR DEVICE

(75) Inventors: Sun-kook Kim, Hwaseong-si (KR); Woong Choi, Seongman-si (KR); Sang-yoon Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 420 days.

(21) Appl. No.: 13/295,620

(22) Filed: Nov. 14, 2011

(65) Prior Publication Data
US 2012/0223288 A1    Sep. 6, 2012

(30) Foreign Application Priority Data

Mar. 4, 2011    (KR) ......... 10-2011-0019650

(51) Int. Cl.
| | | |
|---|---|---|
| *H01L 29/76* | (2006.01) | |
| *H01L 29/06* | (2006.01) | |
| *H01L 29/10* | (2006.01) | |
| *B82Y 10/00* | (2011.01) | |
| *B82Y 40/00* | (2011.01) | |
| *H01L 29/775* | (2006.01) | |
| *H01L 29/786* | (2006.01) | |
| *H01L 51/00* | (2006.01) | |
| *H01L 51/05* | (2006.01) | |
| *H01L 51/42* | (2006.01) | |

(52) U.S. Cl.
CPC ........ *H01L 29/0673* (2013.01); *H01L 29/1029* (2013.01); *B82Y 10/00* (2013.01); *B82Y 40/00* (2013.01); *H01L 29/1033* (2013.01); *H01L 29/775* (2013.01); *H01L 29/78648* (2013.01); *H01L 29/78696* (2013.01); *H01L 51/0048* (2013.01); *H01L 51/0558* (2013.01); *H01L 51/0579* (2013.01); *H01L 51/0554* (2013.01); *H01L 51/0562* (2013.01); *H01L 51/424* (2013.01); *Y02E 10/549* (2013.01)
USPC .................................. 257/288; 257/E29.245

(58) Field of Classification Search
CPC ............ H01L 29/0673; H01L 29/1033; H01L 29/1025; H01L 29/1029; H01L 29/78648; H01L 29/78696; B82Y 10/00
USPC ........... 257/288, E29.245, E29.264, E29.275; 977/938
See application file for complete search history.

(56) References Cited

U.S. PATENT DOCUMENTS

| | | | |
|---|---|---|---|
| 7,893,492 B2 * | 2/2011 | Bedell et al. ................... | 257/346 |
| 2004/0238887 A1 * | 12/2004 | Nihey .............................. | 257/347 |
| 2007/0017439 A1 * | 1/2007 | Xianyu et al. .................. | 117/108 |
| 2009/0162998 A1 * | 6/2009 | Lee et al. ........................ | 438/478 |
| 2009/0201743 A1 * | 8/2009 | Yang ......................... | 365/185.28 |
| 2009/0246408 A1 * | 10/2009 | Chan et al. ..................... | 427/577 |
| 2010/0295024 A1 * | 11/2010 | Pernel et al. ...................... | 257/24 |
| 2011/0147715 A1 * | 6/2011 | Rogers et al. .................... | 257/24 |
| 2012/0012817 A1 * | 1/2012 | Hong et al. ...................... | 257/29 |
| 2012/0028820 A1 * | 2/2012 | Rhodes et al. .................... | 506/9 |
| 2012/0032149 A1 * | 2/2012 | Chen et al. ....................... | 257/24 |
| 2012/0292598 A1 * | 11/2012 | Chang et al. ..................... | 257/29 |
| 2013/0119348 A1 * | 5/2013 | Zhou et al. ....................... | 257/29 |

* cited by examiner

*Primary Examiner* — Joseph C Nicely
(74) *Attorney, Agent, or Firm* — Harness, Dickey & Pierce, P.L.C.

(57) ABSTRACT

An example embodiment relates to a transistor including a channel layer. A channel layer of the transistor may include a plurality of unit layers spaced apart from each other in a vertical direction. Each of the unit layers may include a plurality of unit channels spaced apart from each other in a horizontal direction. The unit channels in each unit layer may form a stripe pattern. Each of the unit channels may include a plurality of nanostructures. Each nanostructure may have a nanotube or nanowire structure, for example a carbon nanotube (CNT).

8 Claims, 12 Drawing Sheets

SEMICONDUCTOR DEVICE, METHOD OF MANUFACTURING THE SAME, AND ELECTRONIC DEVICE INCLUDING THE SEMICONDUCTOR DEVICE

CROSS-REFERENCE TO RELATED APPLICATIONS

This application claims priority under 35 U.S.C. §119 to the benefit of Korean Patent Application No. 10-2011-0019650, filed on Mar. 4, 2011, in the Korean Intellectual Property Office, the disclosure of which is incorporated herein in its entirety by reference.

BACKGROUND

1. Field

Some example embodiments relate to semiconductor devices, methods of manufacturing the same, and electronic devices including the semiconductor devices.

2. Description of the Related Art

Semiconductor devices, such as transistors and diodes, are used for various purposes in various electronic device fields. For example, a transistor is used as a switching device or a driving device in a display, a memory device and a logic circuit field, or as a basic element of various circuits.

Most commercialized transistors are silicon (Si)-based metal oxide semiconductor field effect transistors (MOS-FETs). However, due to the limitations of characteristics and manufacturing processes of the Si-based MOS-FETs, next-generation materials and devices are studied. For example, one area of interest is manufacturing a transistor using a nanostructure, such as a carbon nanotube (CNT), as a channel layer. The CNT may be advantageous to miniaturize a device since the CNT has a very small diameter from several to dozens of nanometers (nm), and has excellent characteristics such as high mobility, high electric conductivity, high thermal conductivity, and high mechanical strength. Accordingly, the CNT receives attention as a material for overcoming the limitations of an existing device.

However, if a semiconductor device, such as the transistor, is manufactured by using the nanostructure, such as the CNT, there may be a large device-to-device variation because it is difficult to form CNTs having uniform characteristics, sizes, and densities. Moreover, it is difficult to reproducibly synthesize the CNT and handle the synthesized CNT. Thus, realizing a semiconductor device employing the CNT is impeded and limited.

SUMMARY

Provided are semiconductor devices that may have good uniformity in characteristics and have excellent operation characteristics.

Provided are methods of manufacturing the semiconductor devices.

Provided are electronic devices including the semiconductor devices.

Additional aspects will be set forth in part in the description which follows and, in part, will be apparent from the description, or may be learned by practice of the presented example embodiments.

According to an example embodiment, a transistor includes a channel layer, a source, a drain, and a gate, wherein the channel layer includes a plurality of unit layers spaced apart from each other in a vertical direction, and each of the plurality of unit layers includes a plurality of unit channels spaced apart from each other in a horizontal direction.

The plurality of unit channels in each of the plurality of unit layers may form a stripe pattern.

Each of the plurality of unit channels may include a plurality of nanostructures.

Each of the plurality of nanostructures may have a nanotube or nanowire structure.

The plurality of nanostructures may include carbon nanotubes (CNTs).

The plurality of nanostructures in each of the plurality of unit channels may have a network structure.

A ratio (L/W) of a length (L) to a width (W) of each of the plurality of unit channels may be equal to or more than about 5.

The transistor may further include an insulation layer between every two adjacent unit layers of the plurality of unit layers.

The gate may be a first gate, the transistor further comprises a second gate spaced apart from the first gate, and the channel layer is disposed between the first and second gates.

According to an example embodiment, an electronic device includes the transistor.

The electronic device may be a display.

The transistor may be included as a driving device or a switching device in the electronic device.

According to an example embodiment, a method of manufacturing a transistor including a channel layer, a source, a drain, and a gate, wherein forming of the channel layer includes forming a plurality of unit layers spaced apart from each other in a vertical direction, and the forming of the plurality of unit layers includes forming a plurality of unit channels spaced apart from each other in a horizontal direction in each of the plurality of unit layers.

The method may include: forming a first semiconductor layer; forming a first unit layer including a plurality of first unit channels by patterning the first semiconductor layer; forming a first insulation layer covering the plurality of first unit channels; forming a second semiconductor layer on the first insulation layer; and forming a second unit layer including a plurality of second unit channels by patterning the second semiconductor layer.

The method may further include: forming a first source layer and a first drain layer respectively contacting ends of the first semiconductor layer; and forming a second source layer and a second drain layer respectively contacting ends of the second semiconductor layer, and respectively connected to the first source layer and the first drain layer.

The method may further include: forming a second insulation layer covering the plurality of second unit channels; forming a third semiconductor layer on the second insulation layer; and forming a third unit layer including a plurality of third unit channels by patterning the third semiconductor layer.

The method may further include forming a third source layer and a third drain layer respectively contacting ends of the third semiconductor layer, and respectively connected to the second source layer and the second drain layer.

Each of the plurality of unit channels may include a plurality of nanostructures.

Each of the plurality of nanostructures may have a nanotube or nanowire structure.

The plurality of nanostructures may include carbon nanotubes (CNTs).

According to an example embodiment, a diode includes a first layer and a second layer, which are combined to each other, wherein the first layer includes a plurality of unit layers spaced apart from each other in a vertical direction, and each of the plurality of unit layers includes a plurality of semiconductor elements spaced apart from each other in a horizontal direction.

The plurality of semiconductor elements in each of the plurality of unit layers may form a stripe pattern.

Each of the plurality of semiconductor elements may include a plurality of nanostructures.

The plurality of nanostructures may include carbon nanotubes (CNTs).

The plurality of nanostructures in each of the plurality of semiconductor elements may have a network structure.

A ratio (L/W) of a length (L) to a width (W) of each of the plurality of semiconductor elements may be equal to or more than about 5.

The second layer may be a semiconductor layer, and a conductive type of the second layer may be different from a conductive type of the plurality of the semiconductor elements of the first layer.

The second layer may be a metal layer. Here, the second layer may form a Schottky junction with the plurality of semiconductor elements of the first layer.

According to an example embodiment, an electronic device includes the diode.

The electronic device may be a photoelectronic device.

The photoelectronic device may be a solar cell.

According to an example embodiment, a method of manufacturing a diode comprising a first layer and a second layer, which are combined to each other, wherein forming of the first layer includes forming a plurality of unit layers spaced apart from each other in a vertical direction, and the forming of the plurality of unit layers includes forming a plurality of semiconductor elements spaced apart from each other in a horizontal direction in each of the plurality of unit layers.

The method may include: forming a first semiconductor layer; forming a first unit layer including a plurality of first semiconductor elements by patterning the first semiconductor layer; forming a first insulation layer covering the plurality of first semiconductor elements; forming a second semiconductor layer on the first insulation layer; and forming a second unit layer including a plurality of second semiconductor elements by patterning the second semiconductor layer.

The method may further include: forming a first material layer contacting one end of the first semiconductor layer; and forming a second material layer contacting one end of the second semiconductor layer and connected to the first material layer.

The method may further include: forming a second insulation layer covering the plurality of second semiconductor elements; forming a third semiconductor layer on the second insulation layer; and forming a third unit layer including a plurality of third semiconductor elements by patterning the third semiconductor layer.

The method may further include forming a third material layer contacting one end of the third semiconductor layer and connected to the second material layer.

Each of the first, second, and third material layers may be a part of the second layer.

Each of the plurality of semiconductor elements may include a plurality of nanostructures.

Each of the plurality of nanostructures may have a nanotube or nanowire structure.

The plurality of nanostructures may include carbon nanotubes (CNTs).

BRIEF DESCRIPTION OF THE DRAWINGS

These and/or other aspects will become apparent and more readily appreciated from the following description of non-limiting example embodiments, taken in conjunction with the accompanying drawings of which.

DETAILED DESCRIPTION

Various example embodiments will now be described more fully with reference to the accompanying drawings in which some example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, semiconductor devices, methods of manufacturing the same, and electronic devices including the semiconductor devices will be described in detail with reference to accompanying drawings. In the drawings, like reference numerals denote like elements, and the width and thicknesses of layers and regions are exaggerated for clarity.

Figure 1:
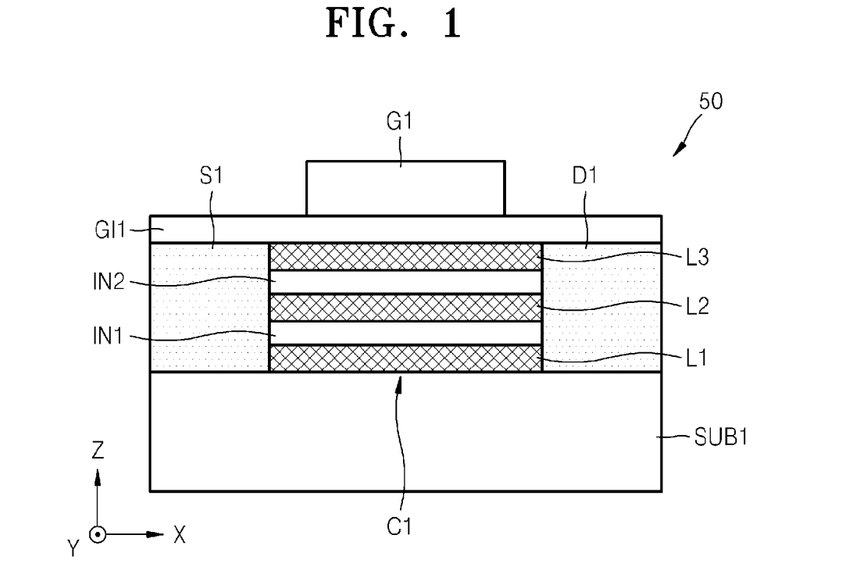
FIG. 1 is a cross-sectional view of a transistor according to an example embodiment.

FIG. 1 is a cross-sectional view of a transistor (semiconductor device) 50 according to an example embodiment.

Referring to FIG. 1, a channel layer C1 may be disposed on a substrate SUB1. The substrate SUB1 may be a glass substrate or any one of various substrates used in a general semiconductor device manufacturing process, such as a plastic substrate and a silicon substrate. The substrate SUB1 may be a flexible or rigid substrate, and may be transparent or opaque. The channel layer C1 may include a plurality of unit layers L1 through L3 spaced apart from each other in a vertical direction, i.e., in a Z-axis direction. The number of unit layers is not limited to three, and may vary. Insulation layers IN1 and IN2 may be disposed respectively between the unit layers L1 and L2, and between the unit layers L2 and L3. The insulation layers IN1 and IN2 may operate as barriers for each of the unit layers L1 through L3 to maintain their electric characteristics. The insulation layers IN1 and IN2 may be formed of an inorganic insulation material, such as a silicon oxide, a silicon nitride, or an aluminum oxide, or an organic insulation material. A structure of the unit layers L1 through L3 will be described in detail below with reference to FIG. 2.

A source electrode S1 and a drain electrode D1 respectively contacting ends (or sides) of the channel layer C1 may be included in the transistor. The source and drain electrodes S1 and D1 may be formed of any metal used in a general semiconductor device manufacturing process to form an electrode, or may be formed of a transparent conductive oxide (TCO), such as an indium tin oxide (ITO) or an indium zinc oxide (IZO). Alternatively, the source and drain electrodes S1 and D1 may be formed of graphene. The graphene is a hexagonal single layer structure formed of carbon atoms, and not only has high charge mobility and low specific resistance, but also excellent translucency. The source and drain electrodes S1 and D1 may have a single or multi-layer structure. The unit layers L1 through L3 may be connected in parallel between the source and drain electrodes S1 and D1. One ends of the unit layers L1 through L3 may be connected to the source electrode S1 and other ends of the unit layers L1 through L3 may be connected to the drain electrode D1.

A gate G1 for controlling electric characteristics of the channel layer C1 may be further provided. The gate G1 may be disposed, for example, above the channel layer C1. Like the source and drain electrodes S1 and D1, the gate G1 may be formed of one of various metals, a transparent conductive oxide, or another material, such as graphene. The gate G1 may be a same material layer as or a different material layer from the source and drain electrodes S1 and D1.

A gate insulation layer GI1 may be disposed between the channel layer C1 and the gate G1. The gate insulation layer GI1 may include a silicon oxide, a silicon oxynitride, a silicon nitride, or a high dielectric material having a dielectric constant higher than that of the silicon nitride. The gate insulation layer GI1 my have a single or multi-layer structure.

Figure 2:
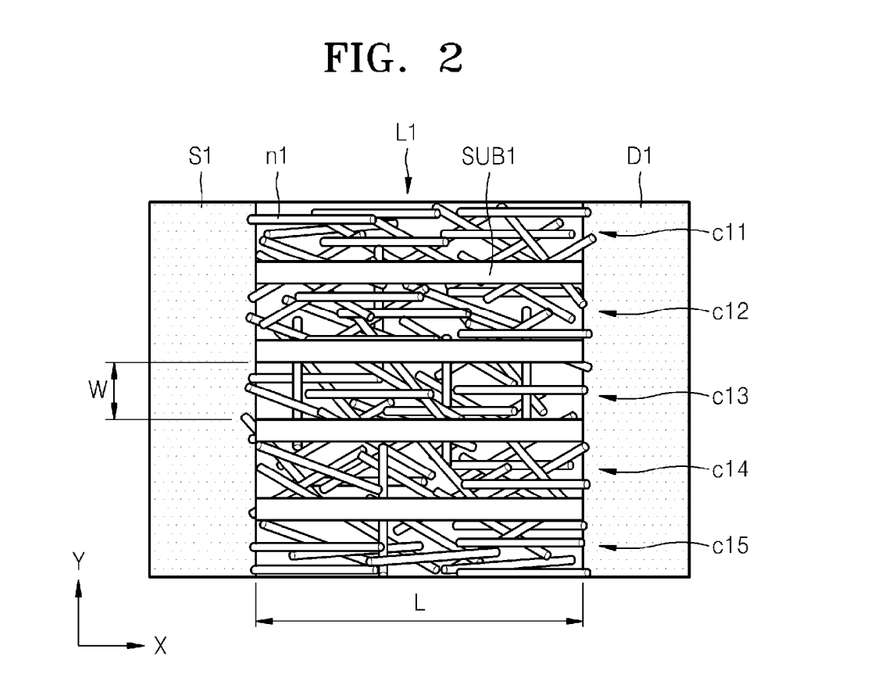
FIG. 2 is a plan view of a unit layer (channel layer) used in the transistor of FIG. 1.

FIG. 2 is a plan view of the unit layer L1 from among the unit layers L1 through L3 of FIG. 1.

Referring to FIG. 2, the unit layer L1 may include a plurality of unit channels c11 through c15 spaced apart from each other in a horizontal direction, i.e., in a Y-axis direction. The number of unit channels c11 through c15 is not limited to five, and may vary. The unit channels c11 through c15 may form a stripe pattern in the unit layer L1. In other words, the unit channels c11 through c15 may have linear shapes arranged in parallel. The unit channels c11 through c15 may be connected in parallel between the source and drain electrodes S1 and D1. Each of the unit channels c11 through c15 may include a plurality of nanostructures n1. The nanostructures n1 may have a nanotube or nanowire structure. For example, the nanostructure n1 may be a carbon nanotube (CNT) or a nanowire formed of a semiconductor such as silicon (Si), a zinc oxide (ZnO), an indium oxide ($In_2O_3$), a titanium oxide ($TiO_2$), or a vanadium oxide ($V_2O_5$). The nanostructures n1 in each of the unit channels c11 through c15 may have a network structure. In other words, each of the unit channels c11 through c15 may have a structure in which the nanostructures n1 cross each other in different directions. Since the nanostructures n1 are connected to (contact) each other while crossing each other in different directions, each of the unit channels c11 through c15 may operate as a "channel" for connecting the source and drain electrodes S1 and D1. A ratio (L/W) of a length L to a width W of each of the unit channels c11 through c15 may be equal to or more than about 5.

Figure 3:
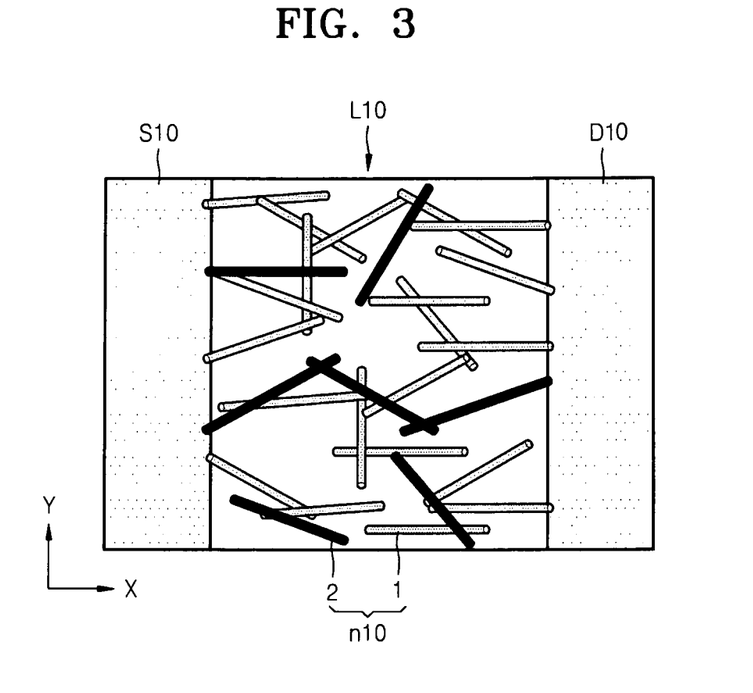
FIG. 3 is a plan view of a unit layer (channel layer) according to a comparative example.
Figure 4:
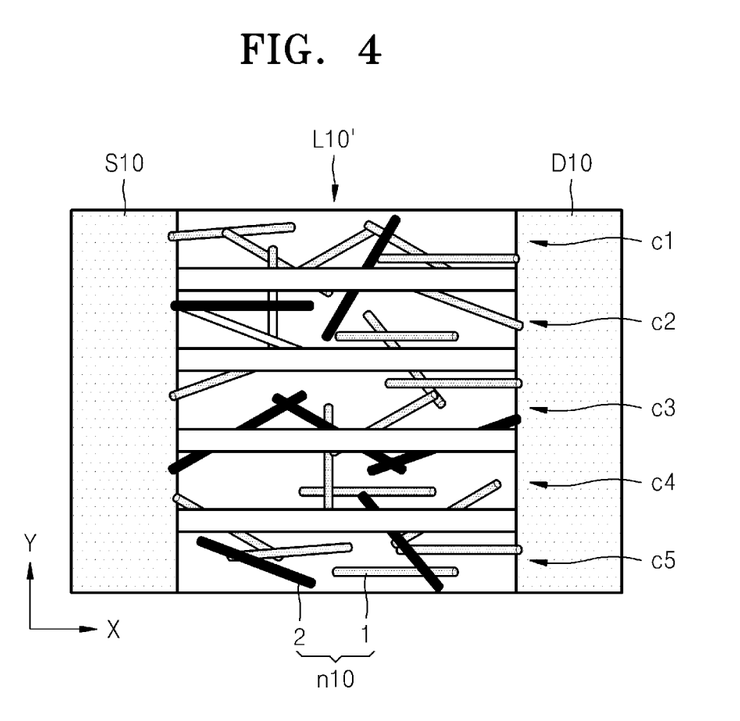
FIG. 4 is a plan view of a unit layer (channel layer) according to an example embodiment, which is patterned from the unit layer (channel layer) of FIG. 3.

Since the unit layer L1 has the structure shown in FIG. 2, i.e., a stripe pattern structure, the characteristics and uniformity of the unit layer L1 may be improved. This will be described in detail with reference to FIGS. 3 and 4. In FIGS. 3 and 4, nanostructures n10 have low densities for convenience, but densities of the nanostructures n10 may be higher than illustrated.

FIG. 3 is a plan view of a unit layer L10 according to a comparative example for comparing with a unit layer according to an example embodiment (the unit layer L1 of FIG. 2).

Referring to FIG. 3, the unit layer L10 according to the comparative example has a continuous structure. In other words, the unit layer L10 has a layer structure that is not patterned into a stripe pattern. The unit layer L10 has a structure in which the nanostructures n10 cross each other in different directions, i.e., a network structure. In the comparative example, the nanostructures n10 may be a CNT. Generally, when a plurality of CNTs are synthesized (grown), ⅔ of the CNTs become semiconductive CNTs, and the remaining ⅓ of the CNTs become metallic CNTs. Accordingly, in the nanostructures n10 forming the unit layer L10 of FIG. 3, about ⅔ of the nanostructures n10 may be semiconductive CNTs 1, and about ⅓ of the nanostructures n10 may be metallic CNTs 2. Here, the metallic CNTs 2 may connect a source electrode S10 and a drain electrode D10. In other words, the source and drain electrodes S10 and D10 may be connected to each other by the metallic CNTs 2. In this case, an off-current of a transistor may increase, and a threshold voltage of the transistor may be decreased to an undesired level. Specifically, when formation densities of the nanostructures n10, i.e., CNTs, increase, the possibility of the metallic CNTs 2 connecting the source and drain electrodes S10 and D10 increases. Also, since locations of the semiconductive CNTs 1 and the metallic CNTs 2 may be random, densities of the semiconductive CNTs 1 and the metallic CNTs 2 may not be uniform, and sizes (diameters, length, or the like) of the semiconductive CNTs 1 and the metallic CNTs 2 may not be uniform, when the unit layer L10 is used as a channel, device-to-device variations may increase.

However, when the structure of FIG. 3 is patterned to form a structure of FIG. 4, the source and drain electrodes S10 and D10 may be prevented from being connected to each other by the metallic CNTs 2, and thus, the uniformity of the transistor may be obtained and the operation characteristics of the transistor may be improved. In detail, when a unit layer L10' having a stripe pattern structure is formed as shown in FIG. 4, the metallic CNTs 2 break (divided), and thus, the possibility that the source and drain electrodes S10 and D10 are connected to each other by the metallic CNTs 2 may be decreased. In other words, the possibility of an electric short or similar phenomenon between the source and drain electrodes S10 and D10 due to the metallic CNTs 2 may be decreased. Specifically, as the lengths of unit channels c1 through c5 are increased and the widths of the unit channels c1 through c5 are decreased, the source and drain electrodes S10 and D10 are less likely to be connected to each other by the metallic CNTs 2. In this regard, a ratio (L/W) of the length to the width of each of the unit channels c1 through c5 may be equal to or more than about 5. Accordingly, when the unit layer L10' having the stripe pattern structure of FIG. 4 is used, on/off-current ratio of the transistor may be increased, uniformity may be obtained, and the operation characteristics of the transistor may be improved.

Figure 5:
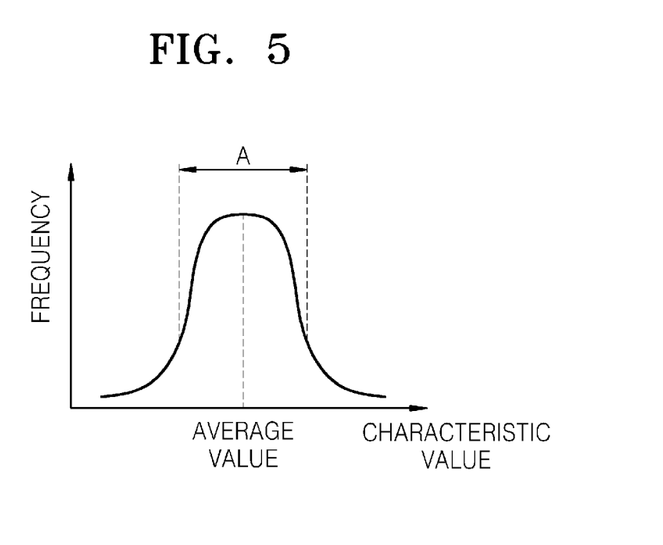
FIG. 5 is a graph of the characteristic distribution of unit channels, according to an example embodiment.

Further, as shown in FIG. 1, when the unit layers L1 through L3 are spaced apart form each other in the vertical direction, higher uniformity may be obtained and the operation characteristics of the transistor may be further improved. In detail, when the unit layers L1 through L3 are spaced apart from each other in the vertical direction, electric characteristics of the unit channels (c11 through c15 in FIG. 2) included in the unit layers L1 through L3 may approach an average value, and thus, the uniformity and the operation characteristics of the transistor may be improved. Although characteristics of the unit channels of the unit layers L1 through L3 may be somewhat uniform, there still may be deviation. The characteristics of the unit channels may have a distribution shown in FIG. 5 which is similar to a normal distribution. For example, about 90% of the unit channels may have normal values corresponding to a region A, and the remaining 10% may have values deviating from the region A. However, as the number of stacked unit layers L1 through L3 increases, the characteristics of the unit channels may approach a statistical average value. In other words, as the stacked number of unit layers L1 through L3 increases, the number of unit channels also increases, and thus, the characteristics of the unit channels may approach the normal values in the region A. Thus, according to an example embodiment, device-to-device variations may be reduced, and a semiconductor device having more uniform electric characteristics may be realized.

Also, when the transistor 50 of FIG. 1 uses the nanostructures n1 of FIG. 2 as channel elements, mobility of the transistor may be about 10 times faster than that of a general transistor. Specifically, when CNTs are used as the nanostructures n1, the characteristics, such as mobility of the transistor, may be significantly improved, and thus, a high performance electronic device, such as a liquid crystal display device or an organic light-emitting display device, may be realized.

Further, the transistor of FIG. 1 may have a transparent characteristic overall. The nanostructures n1 used in the channel layer C1 may be a transparent structure having a minute size (nanoscale). Materials for forming the source and drain electrodes S1 and D1 and the gate G1 may also be a transparent material, such as a transparent conductive oxide or graphene. Accordingly, the transistor may be transparent overall. For example, the transistor according to an example embodiment may have light transmittance equal to or more than about 80%. Also, when the substrate SUB1 of FIG. 1 is flexible, the transistor may also be flexible. Since the unit layers L1 through L3 of the channel layer C1 have a structure in which the nanostructures n1 cross each other in different directions, the unit layers L1 through L3 may be flexible, and the source and drain electrodes S1 and D1 and the gate G1 may also be flexible. Accordingly, the transistor of FIG. 1 may be flexible. For example, the transistor according to an example embodiment may have flexible elongation equal to or more than about 30%. However, the transistor according to an example embodiment does not have to be flexible or transparent. In other words, the transistor according to an example embodiment may be neither flexible nor transparent.

Figure 6:
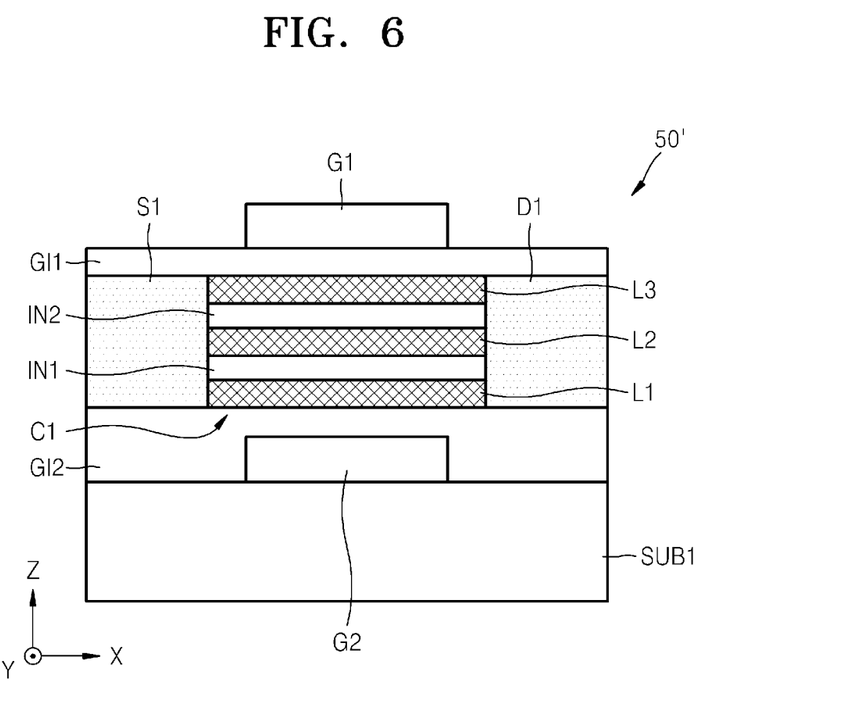
FIG. 6 is a cross-sectional view of a transistor according to an example embodiment.

FIG. 6 is a cross-sectional view of a transistor (semiconductor device) 50' according to an example embodiment. The transistor 50' of FIG. 6 is modified from the transistor of FIG. 1, and another gate G2 (hereinafter, referred to as second gate G2) is further disposed below a channel layer C1 in FIG. 6.

Referring to FIG. 6, the second gate G2 may be disposed on a substrate SUB1, and a second gate insulation layer GI2 may cover the second gate G2. The channel layer C1, a source electrode S1, a drain electrode D1, a first gate insulation layer GI1, and a first gate G1 may be disposed on the second gate insulation layer GI2. The channel layer C1, the source electrode S1, the drain electrode D1, the first gate insulation layer GI1, and the first gate G1 of FIG. 6 may respectively be the same as (or substantially similar to, except for dimensional differences) the channel layer C1, the source electrode S1, the drain electrode D1, the gate insulation layer GI1, and the gate G1 of FIG. 1.

When the first and second gates G1 and G2 are respectively disposed on sides (top and bottom) of the channel layer C1 as shown in FIG. 6, gating characteristics may be improved since electric characteristics of the channel layer C1 are controlled by the first and second gates G1 and G2.

FIGS. 7A through 7L are perspective views for describing a method of manufacturing a transistor (semiconductor device), according to an example embodiment.

Figure 7A:
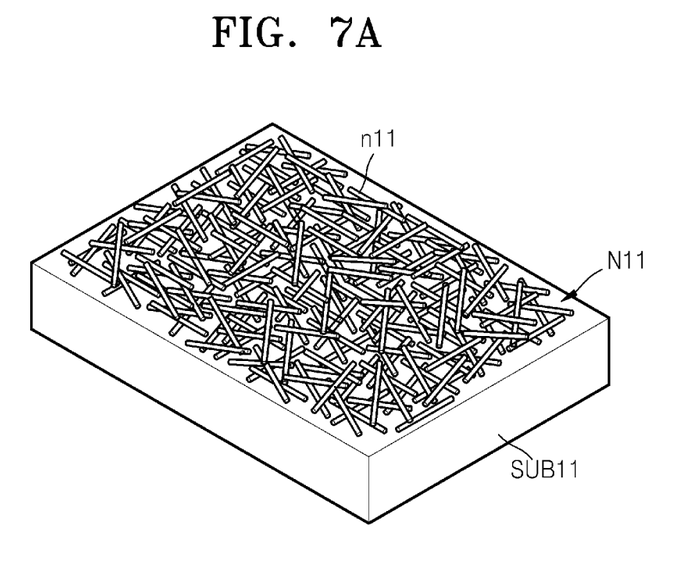
FIGS. 7A through 7L are perspective views for describing a method of manufacturing a transistor, according to some example embodiments.

Referring to FIG. 7A, a first nanostructure layer N11, including a plurality of nanostructures n11, may be formed on a substrate SUB11. The nanostructures n11 may have a network structure. The nanostructures n11 may be formed (grown) by various methods. For example, a plurality of catalyst dots are formed on the substrate SUB11, and then the nanostructures n11 may be grown in a horizontal direction from the catalyst dots by using a chemical vapor deposition (CVD) method. Here, the catalyst dots may be formed by thinly depositing a catalyst metal layer, such as an iron (Fe), nickel (Ni), or copper (Cu) layer, in a thickness from about 1 to 10 Å, on the substrate SUB11 by using a CVD or physical vapor deposition (PVD) method, and then transforming the catalyst metal layer into a plurality of dot shapes via a thermal process. Since the catalyst dots have a relatively uniform distribution, the nanostructures n11 grown from the catalyst dots may also have a relatively uniform distribution (formation densities). A different method of forming the nanostructures n11 may be used. For example, pre-synthesized nanostructures may be dispersed in a predetermined solution to prepare a mixture, and then the mixture may be poured on the substrate SUB11 to form the first nanostructure layer N11 having the network structure. In this case, the nanostructures n11 may be relatively uniformly distributed on the substrate SUB11. Alternatively, the nanostructures n11 may be formed (grown) on the substrate SUB11 by using any other method.

Figure 7B:
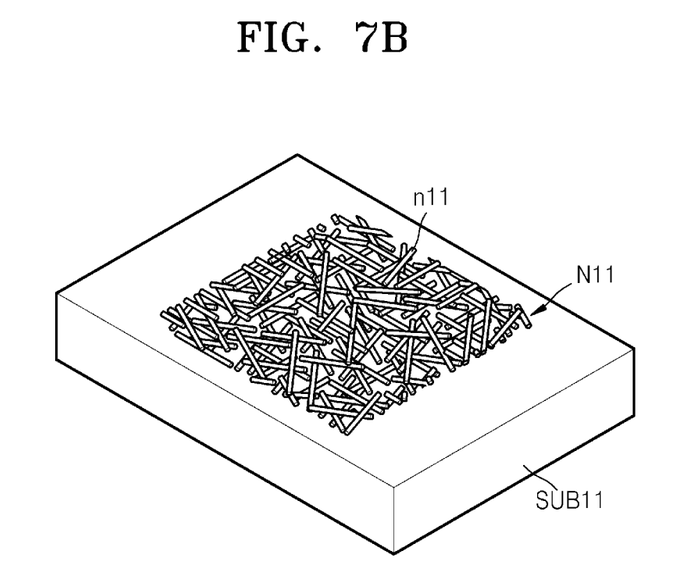

Referring to FIG. 7B, the first nanostructure layer N11 may be patterned into a desired (or alternatively predetermined) shape. The patterned first nanostructure layer N11 may correspond to a single active region.

Figure 7C:
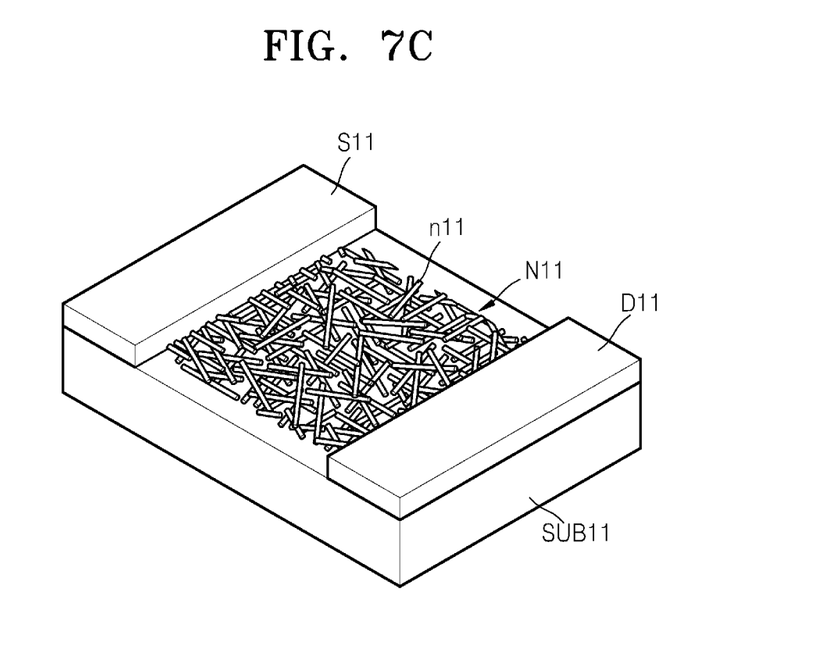

Referring to FIG. 7C, a first source electrode S11 and a first drain electrode D11 respectively contacting ends of the first nanostructure layer N11 may be formed. The first source electrode S11 and the first drain electrode D11 may be formed of one of various metals used in a general semiconductor device forming process to form an electrode, or may be formed of a transparent conductive oxide (TCO), such as ITO and IZO, or another material, for example, graphene.

Figure 7D:
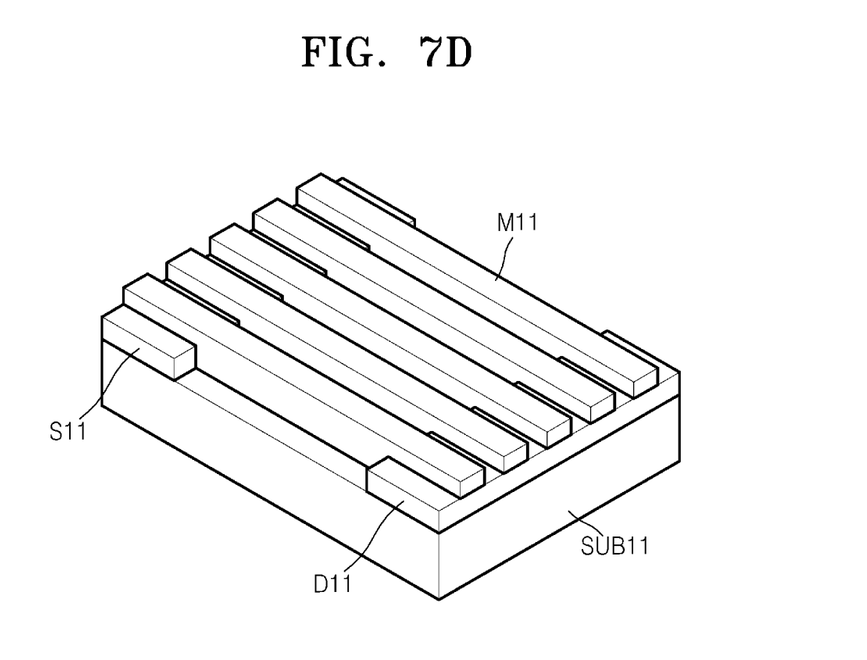

Referring to FIG. 7D, a mask pattern M11 for patterning the first nanostructure layer N11 may be formed. The mask pattern M11 may be a photoresist pattern. The mask pattern M11 may be disposed on the first nanostructure layer N11 between the first source electrode S11 and the first drain electrode D11, and may be extended onto the first source electrode S11 and the first drain electrode D11.

Figure 7E:
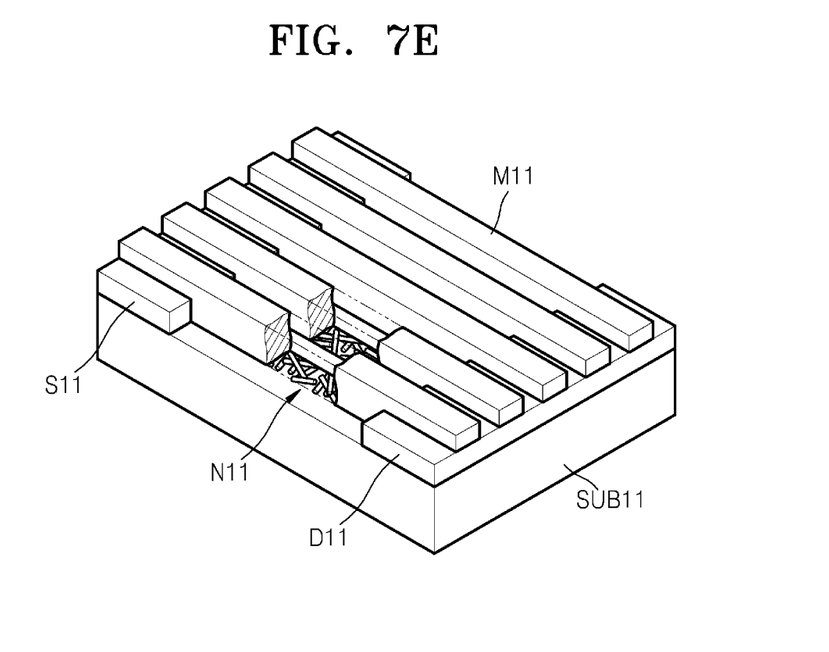

Referring to FIG. 7E, the first nanostructure layer N11 may be patterned by using the mask pattern M11 as an etching barrier. In order to pattern the first nanostructure layer N11, for example, an oxygen plasma etching method may be used. Here, since the first source electrode S11 and the first drain electrode D11 are formed of a metal or a conductive oxide, they may not be etched by oxygen plasma. Accordingly, only the first nanostructure layer N11 between the first source electrode S11 and the first drain electrode D11 may be partially selectively etched (patterned). Here, parts of the first nanostructure layer N11 covered by the first source electrode S11 and the first drain electrode D11, i.e., both ends of the first nanostructure layer N11 are not patterned. Such parts may not be effective channel regions. Accordingly, even if only the part of the first nanostructure layer N11 between the first source electrode S11 and the first drain electrode D11 is patterned and the both ends of the first nanostructure layer N11 covered by the first source electrode S11 and the first drain electrode D11 are not patterned, such a structure may have the same effect and functions as the unit layer L1 of FIG. 2.

Figure 7F:
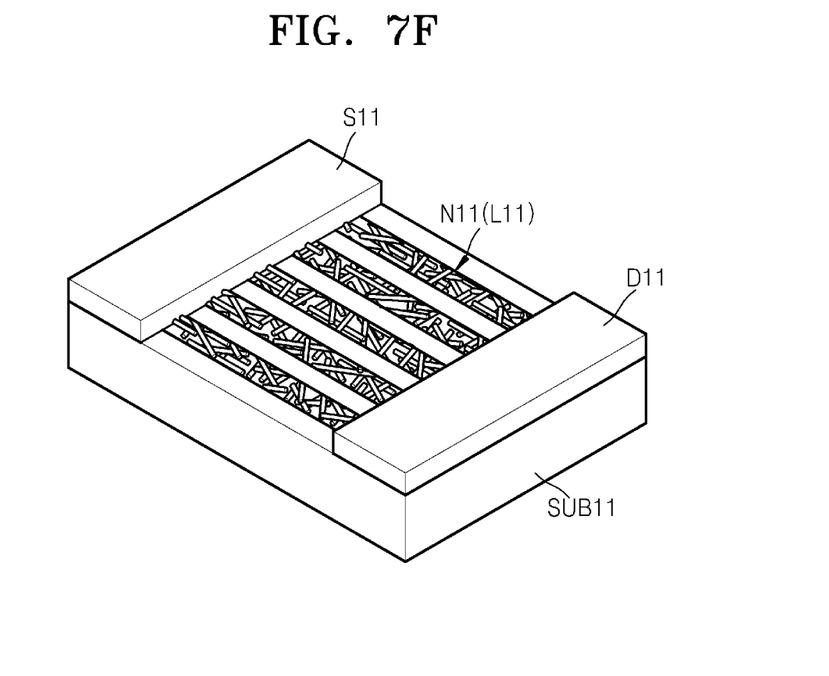

FIG. 7F shows a structure in which the mask pattern M11 is removed from the structure of FIG. 7E. The patterned first nanostructure layer N11 of FIG. 7F will now be referred to as a "first unit layer L11".

Figure 7G:
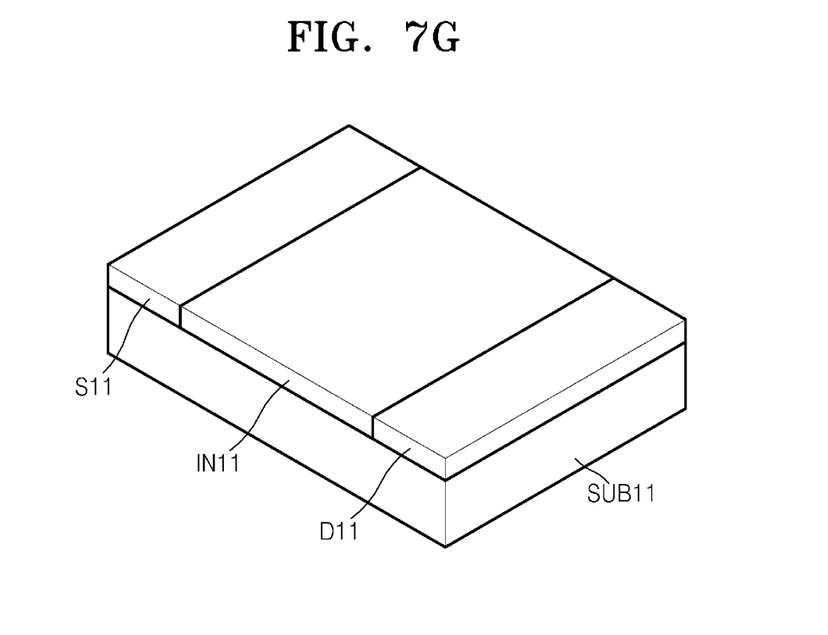

Referring to FIG. 7G, a first insulation layer IN11 may be formed on the first unit layer L11. The first insulation layer IN11 may be formed to cover the first unit layer L11 between the first source electrode S11 and the first drain electrode D11. The first insulation layer IN11 may have the same height as the first source electrode S11 and the first drain electrode D11, and top surfaces of the first source electrode S11 and the first drain electrode D11 may be exposed without being covered by the first insulation layer IN11. The first insulation layer IN11 may be formed of an inorganic insulation material, such as a silicon oxide, a silicon nitride, or an aluminum oxide, or an organic insulation material.

Figure 7H:
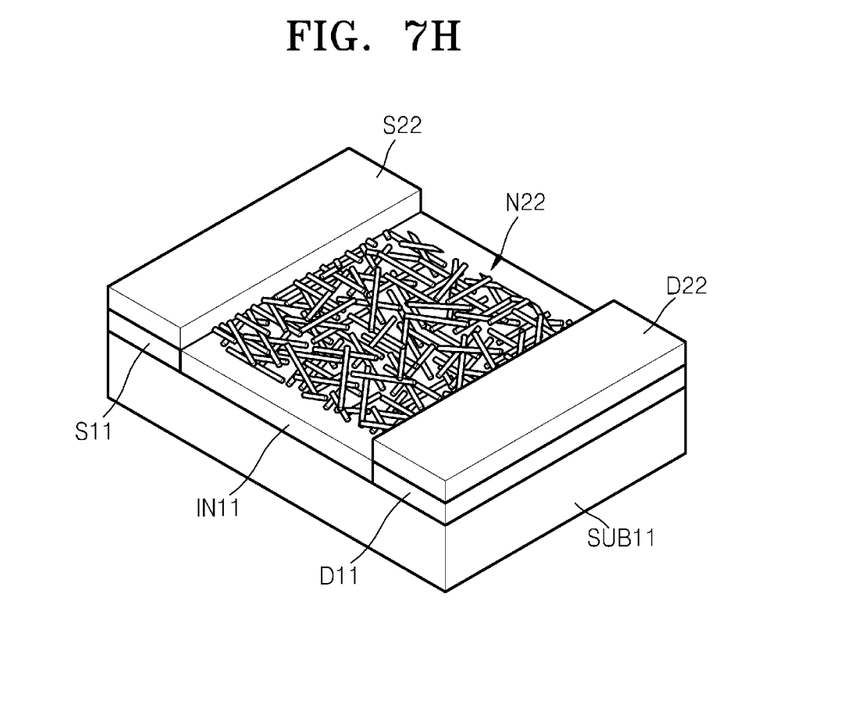

Referring to FIG. 7H, a second nanostructure layer N22 may be formed on the first source electrode S11, the first drain electrode D11, and the first insulation layer IN11. The second nanostructure layer N22 may be formed using the same (or similar) method used to form the first nanostructure layer N11 of FIG. 7B. Next, a second source electrode S22 and a second drain electrode D22 respectively contacting ends of the second nanostructure layer N22 may be formed. The second source electrode S22 and the second drain electrode D22 may respectively contact the first source electrode S11 and the first drain electrode D11.

Figure 7I:
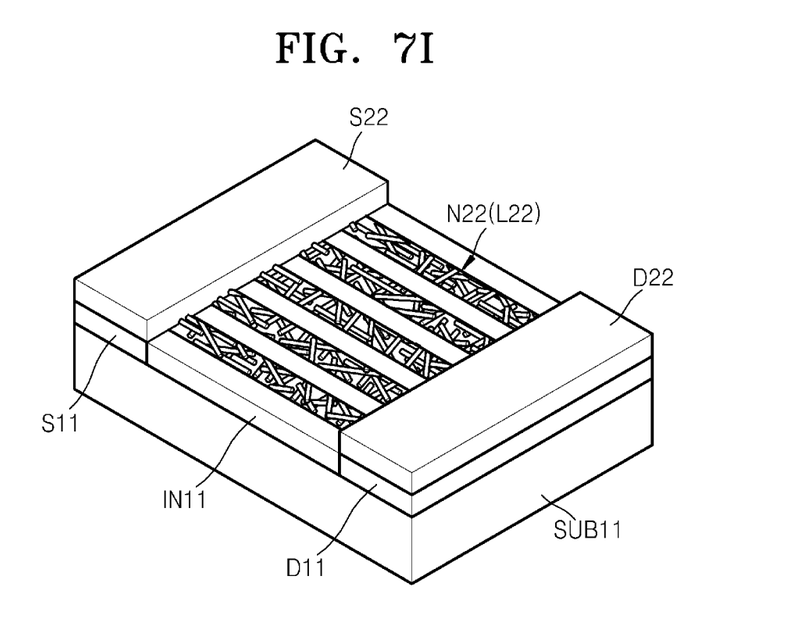

Referring to FIG. 7I, the second nanostructure layer N22 may be patterned. The second nanostructure layer N22 may be patterned by using the same method used to pattern the first nanostructure layer N11 described with reference to FIGS. 7D and 7E. The patterned second nanostructure layer N22 may be referred to as a "second unit layer L22".

Figure 7J:
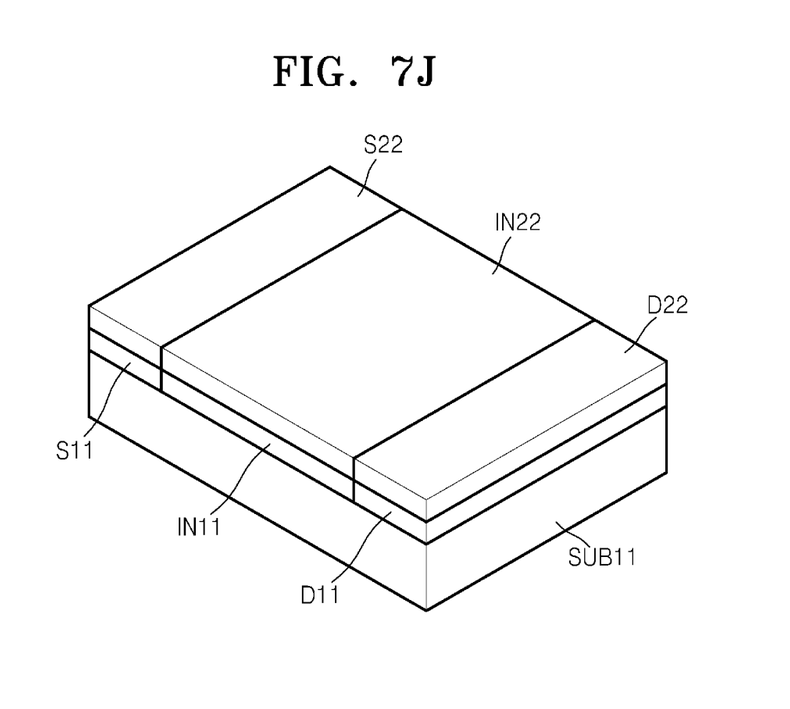

Referring to FIG. 7J, a second insulation layer IN22 covering the second unit layer L22 between the second source electrode S22 and the second drain electrode D22 may be formed. The second insulation layer IN22 may be formed of a material which is the same as that of the first insulation layer IN11.

Figure 7K:
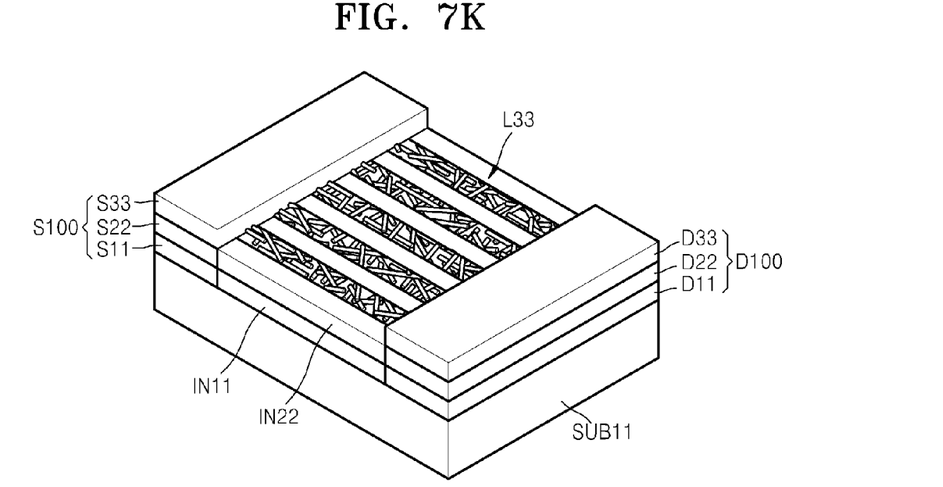

Referring to FIG. 7K, a third unit layer L33, a third source electrode S33, and a third drain electrode D33 may be formed. The third unit layer L33, the third source electrode S33, and the third drain electrode D33 may be respectively formed using the same methods used to form the second unit layer L22, the second source electrode S22, and the second drain electrode D22. Since the first through third source electrodes S11 through S33 are connected (contact) to each other, they may be referred to as a source electrode S100. Similarly, the first through third drain electrodes D11 through D33 may be referred to as a drain electrode D100.

Figure 7L:
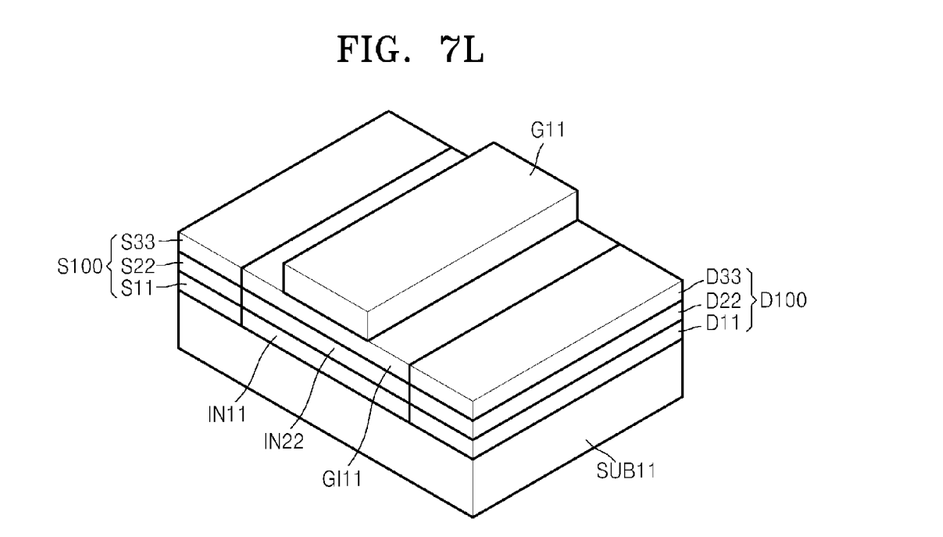

Referring to FIG. 7L, a gate insulation layer GI11 covering the third unit layer L33 (shown in FIG. 7K) may be formed. The gate insulation layer GI11 may not only cover the third unit layer L33, but also the third source electrode S33 and the third drain electrode D33. The gate insulation layer GI11 may be formed of a silicon oxide, a silicon oxynitride, or a silicon nitride, or a high dielectric material having a dielectric constant higher than that of the silicon nitride. Also, the gate insulation layer GI11 may have a single or multi-layer structure. A gate G11 may be formed on the gate insulation layer GI11. Like the first through third source electrodes S11 through S33 and the first through third drain electrodes D11 through D33, the gate G11 may be formed of any one of various metals, a transparent conductive oxide, or another material, such as graphene. The gate G11 may be a same material layer as or a different material layer from the first through third source electrodes S11 through S33 and the first through third drain electrodes D11 through D33.

The method described with reference to FIGS. 7A through 7L is only an example embodiment, and may vary. For example, in FIG. 7B, the first nanostructure layer N11 may be patterned into a stripe pattern structure, and then the first source electrode S11 and the first drain electrode D11 respectively contacting the ends of the patterned first nanostructure layer N11 may be formed. Also, the first through third unit layers L11 through L33 may be formed, and then a source electrode and a drain electrode having a single structure and contacting respectively ends of the first through third unit layers L11 through L33 may be formed. Also, before forming the first nanostructure layer N11 of FIG. 7A, a lower gate and a lower gate insulation layer covering the lower gate may be formed, the first nanostructure layer N11 may be formed on the lower gate insulation layer, and then operations of FIGS. 7B through 7L may be performed. The method may be further modified in various ways.

A transistor according to an example embodiment may be used as a switching device or a driving device in a display, such as a liquid crystal display device or an organic light-emitting display device. As described above, since the transistor has excellent uniformity and operation characteristics, when the transistor is applied to the display, the display may have high reliability, operation characteristics, and performance. Specifically, since the transistor may be transparent, the display including the transistor may have an improved aperture ratio. Since a general Si thin film-based transistor has very low light transmittance less than or equal to about 10%, the general Si thin film-based transistor blocks light incident from a light source (backlight or the like) of a display, thereby decreasing an aperture ratio of the display. However, since the transistor according to an example embodiment may have light transmittance equal to or more than about 80%, the transistor including the transistor has an improved aperture ratio, luminance, and energy efficiency. Also, since the transistor may be a flexible transistor having flexible elongation equal to or more than about 30%, a flexible display may be realized by using the transistor. Since a structure of the liquid crystal display device or organic light-emitting display device is well known, details thereof will be omitted herein. The transistor may be not only used in the display, but also in other electronic devices, such as a memory device and a logic device.

Figure 8:
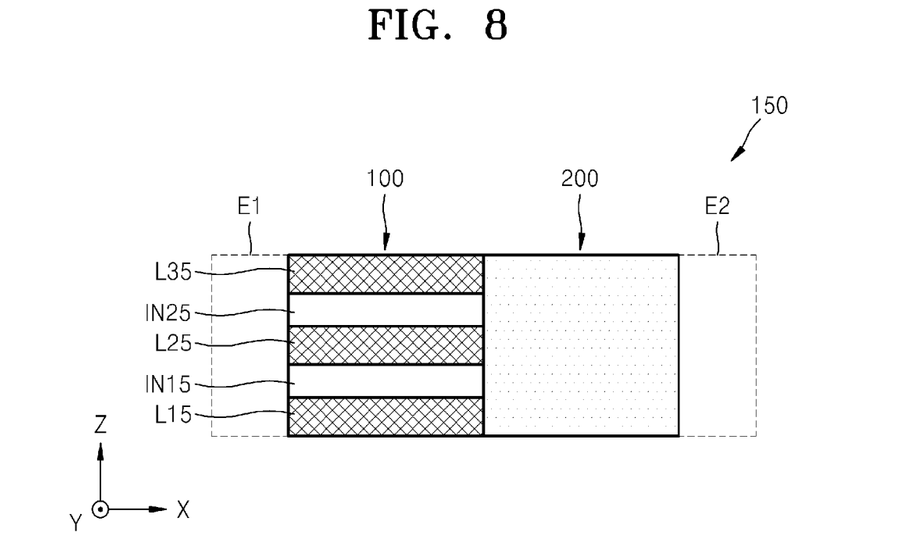
FIG. 8 is a cross-sectional view of a diode according to an example embodiment.

FIG. 8 is a cross-sectional view of a diode (semiconductor device) 150 according to an example embodiment. The diode 150 is a PN diode.

Figure 10:
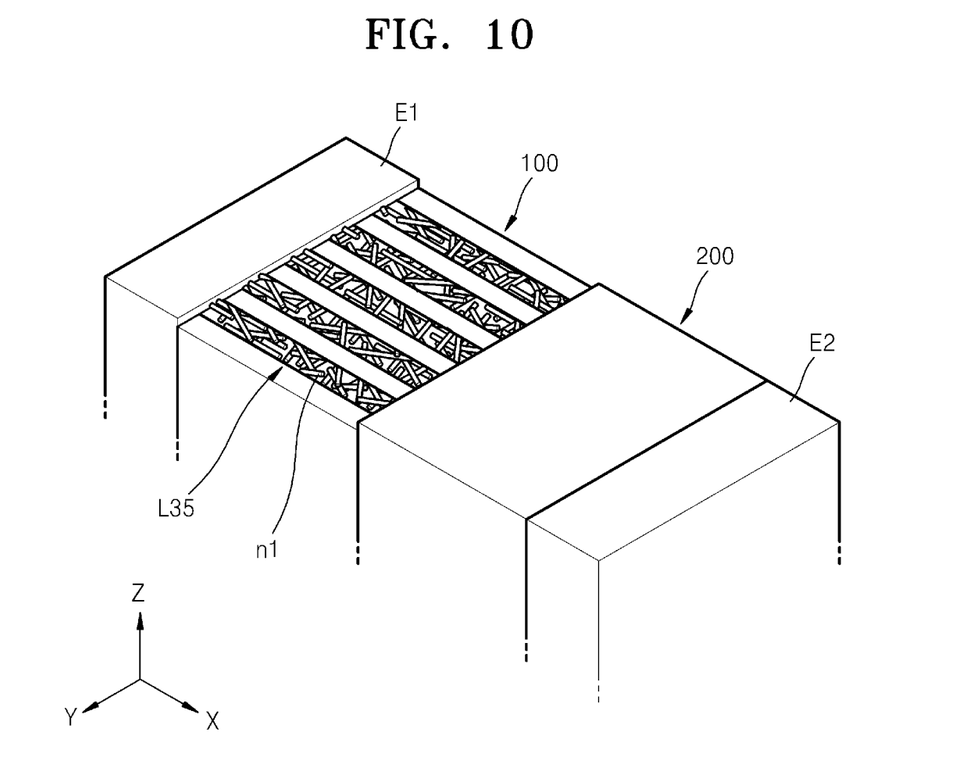
FIG. 10 is a perspective view of a unit layer (first layer) used in a diode according to an example embodiment.

Referring to FIG. 8, a first layer 100 and a second layer 200 may be combined with each other. The first layer 100 may have a similar (or same) multi-layer structure as the channel layer C1 of FIG. 1. In other words, the first layer 100 may have a plurality of unit layers L15 through L35 spaced apart from each other in a vertical direction, i.e., in a Z-axis direction, wherein each of the unit layers L15 through L35 may include a plurality of semiconductor elements spaced apart from each other in a horizontal direction, i.e., a Y-axis direction, as shown in FIG. 10, which illustrates a perspective view of unit layer L35. The semiconductor elements may be the same as (or similar, except for dimensional differences) the unit channels c11 through c15 of FIG. 2. Each semiconductor element may include a plurality of nanostructures, such as CNTs. Since a structure of the first layer 100 is the same (or similar) to that of the channel layer C1 of FIG. 1, details thereof will not be repeated. The second layer 200 combined to the first layer 100 may be a semiconductor. The second layer 200 may be the semiconductor having a conductive type different from the semiconductor elements of the first layer 100. For example, the semiconductor elements of the first layer 100 may be a P-type semiconductor, and the semiconductor elements of the second layer 200 may be an N-type semiconductor. For example, the second layer 200 may be formed of an oxide-based inorganic semiconductor material, such as a zinc oxide (ZnO), a gallium-indium-zinc oxide (GaInZnO), or a hafnium-indium-zinc oxide (HfInZnO), a non-oxide-based inorganic semiconductor material, such as amorphous silicon (a-Si), or an organic semiconductor material. A first electrode E1 and a second electrode E2 for applying a voltage to the PN diode including the first and second layers 100 and 200 may be further provided. The first and second layers 100 and 200 may be connected in series between the first and second electrodes E1 and E2.

Figure 9:
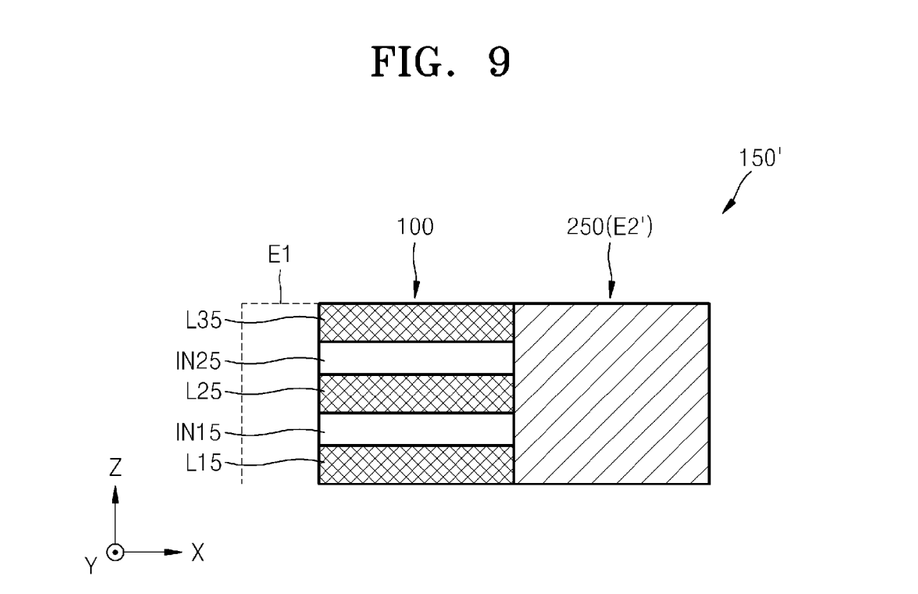
FIG. 9 is a cross-sectional view of a diode according to an example embodiment.

FIG. 9 is a cross-sectional view of a diode (semiconductor device) 150' according to an example embodiment. The diode is a Schottky diode.

Referring to FIG. 9, the Schottky diode 150' may have a structure in which a first layer 100 and a second layer 250 are combined to each other. Since the first layer 100 of FIG. 9 may have the same (or similar, except for dimensional differences) multi-layer structure as the first layer 100 of FIG. 8, details thereof will not be repeated. The second layer 250 may be a metal layer forming a Schottky junction with unit layers L15 through L35 of the first layer 100. Accordingly, the first and second layers 100 and 250 may form the Schottky diode. The Schottky diode may further include a first electrode E1 contacting the first layer 100. Since the second layer 250 is a metal layer, the second layer 250 itself may be used as a second electrode E2'. The first layer 100 may be disposed between the first and second electrodes E1 and E2'.

The diodes 150 and 150' of FIGS. 8 and 9 may be formed using a similar method used to manufacture the transistor described with reference to FIGS. 7A through 7L. In detail, in the method of FIGS. 7A through 7L, a stacked structure of the first through third unit layers L11 through L33 and the first and second insulation layers IN11 and IN2 therebetween may correspond to the first layer 100 of FIG. 8 or 9, and a stacked structure of the first through third drains D11 through D33 may correspond to the second layer 200 or 250 of FIG. 8 or 9. Accordingly, the diodes of FIGS. 8 and 9 may be easily manufactured by modifying the method of FIGS. 7A through 7L.

In detail, a method of manufacturing a diode, according to an example embodiment, may include forming first and second layers that are combined to each other, wherein the forming of the first layer may include forming a plurality of unit layers spaced apart from each other in a vertical direction, and the forming of the plurality of unit layers may include forming a plurality of semiconductor elements spaced apart from each other in a horizontal direction in each unit layer. The method may include forming a first semiconductor layer, forming a first unit layer including a plurality of first semiconductor elements by patterning the first semiconductor layer, forming a first insulation layer covering the plurality of first semiconductor elements, forming a second semiconductor layer on the first insulation layer, and forming a second unit layer including a plurality of second semiconductor elements by patterning the second semiconductor layer. The method may further include forming a first material layer contacting one end of the first semiconductor layer, and forming a second material layer contacting one end of the second semiconductor layer and connected to the first material layer. Also, the method may further include forming a second insulation layer covering the plurality of second semiconductor elements, forming a third semiconductor layer on the second insulation layer, and forming a third unit layer including a plurality of third semiconductor elements by patterning the third semiconductor layer. The method may further include forming a third material layer contacting one end of the third semiconductor layer and connected to the second material layer. Here, each of the first through third material layers may be a part of the second layer. Each semiconductor element may include a plurality of nanostructures, and each nanostructure may have a nanotube or nanowire structure. The nanostructure may be a CNT or a nanowire formed of a semiconductor, such as Si, ZnO, $In_2O_3$, $TiO_2$, or $V_2O_5$. However, such a method is only an example, and may vary.

The diode may be used in various electronic devices. For example, the diode may be used in a photoelectric device, such as a solar cell. Here, the diode may be used as a photoelectric conversion element of the solar cell. Since the use of the diode as the photoelectric conversion element of the solar cell is well known and a general structure of the solar cell is well known, details about the solar cell will be omitted herein. The diode may be used in photoelectric devices other than the solar cell, and in electronic devices other than the photoelectric devices.

It should be understood that the example embodiments described herein should be considered in a descriptive sense only and not for purposes of limitation. Descriptions of features or aspects within each example embodiment should typically be considered as available for other similar features or aspects in other embodiments. For example, the transistors of FIGS. 1 and 6 and the diodes 150 and 150' of FIGS. 8 and 9 may be variously modified. In detail, the nanostructure n1 may have a structure other than the nanotube or nanowire structure, and the unit channels c11 through c15 may have another structure (configuration) other than the network structure of the nanostructures n1. Also, the gate G1 may surround the channel layer C1, and the diode may be changed from a horizontal structure to a vertical structure. Further, the method of FIGS. 7A through 7L may be variously changed. Moreover, example embodiments may be applied to a semiconductor device other than a transistor or a diode. Therefore, it will be understood by one of ordinary skill in the art that variations in form and detail may be made therein without departing from the spirit and scope of the claims.

What is claimed is:
1. A transistor comprising:
a channel layer,
 the channel layer including a plurality of unit layers spaced apart from each other in a vertical direction, and
 each of the plurality of unit layers including a plurality of unit channels spaced apart from each other in a horizontal direction, each of the plurality of unit channels including a plurality of nanostructures, the plurality of nanostructures in each of the plurality of unit channels including a network structure, the plurality of unit channels in each of the plurality of unit layers forming a stripe pattern;
a source arranged laterally on one side of the channel layer;
a drain arranged laterally on an other side of the channel layer; and
a gate corresponding to the channel layer; and
an insulation layer between every two adjacent unit layers, the insulation layer including a first insulation single layer between first and second unit layers of the plurality of unit layers, the first and second unit layers directly contacting lower and upper surfaces of the first insulation single layer, respectively.

2. The transistor of claim 1,
each of the plurality of nanostructures include one of a nanotube and a nanowire.

3. The transistor of claim 2, wherein
the plurality of nanostructures include carbon nanotubes (CNTs).

4. The transistor of claim 1, wherein
a ratio (L/W) of a length (L) to a width (W) of each of the plurality of unit channels is equal to or more than about 5.

5. The transistor of claim 1, wherein
the gate is a first gate,
the transistor further includes a second gate spaced apart from the first gate, and
the channel layer is disposed between the first and second gates.

6. An electronic device comprising the transistor of claim 1.

7. The electronic device of claim 6, wherein
the electronic device is a display.

8. The transistor of claim 1, wherein
the first and second unit layers have a same width as the first insulation single layer.

* * * * *